(12) United States Patent
Jung

(10) Patent No.: US 9,588,153 B2
(45) Date of Patent: Mar. 7, 2017

(54) APPARATUSES AND METHODS FOR DETECTING OVER VOLTAGE AND/OR UNDER VOLTAGE

(71) Applicant: Dongbu Daewoo Electronics Corporation, Seoul (KR)

(72) Inventor: Hee Sok Jung, Seoul (KR)

(73) Assignee: DONGBU DAEWOO ELECTRONICS CORPORATION, Seoul (KR)

( * ) Notice: Subject to any disclaimer, the term of this patent is extended or adjusted under 35 U.S.C. 154(b) by 298 days.

(21) Appl. No.: 14/161,125

(22) Filed: Jan. 22, 2014

(65) Prior Publication Data

US 2015/0177283 A1 Jun. 25, 2015

(30) Foreign Application Priority Data

Dec. 20, 2013 (KR) .......................... 10-2013-0160017

(51) Int. Cl.
*G01R 19/165* (2006.01)
*G01R 19/12* (2006.01)

(52) U.S. Cl.
CPC .......... *G01R 19/165* (2013.01); *G01R 19/12* (2013.01)

(58) Field of Classification Search
CPC ... G01R 19/0038; G01R 19/165; G01R 19/12
USPC .................. 324/76.11, 754.01; 318/400.01
See application file for complete search history.

(56) References Cited

U.S. PATENT DOCUMENTS

| 7,791,293 | B2 * | 9/2010 | Nagase | ..................... | H02P 6/28 318/400.01 |
| 2003/0184533 | A1 * | 10/2003 | Roh | ..................... | G09G 3/2927 345/204 |
| 2009/0251103 | A1 * | 10/2009 | Yamamoto | ............... | B60K 6/48 320/133 |
| 2009/0315583 | A1 * | 12/2009 | Rius Vazquez | .... | G01R 31/3008 324/754.01 |

FOREIGN PATENT DOCUMENTS

| KR | 10-2000-0074999 | 12/2000 |
| KR | 10-2004-0046213 A | 6/2004 |
| KR | 10-2011-0994431 | 8/2011 |

OTHER PUBLICATIONS

Cho, et al. Method for Sensing and Displaying Abnormality of Power in Washing Machine, Abstract of KR 10-2004-0046213; Jun. 5, 2004; http://kpa.kipris.or.kr.

* cited by examiner

*Primary Examiner* — Farhana Hoque

(57) ABSTRACT

An apparatus for detecting over voltage and/or under voltage can include: a reference voltage receiving unit configured to receive a reference voltage; a gradient measuring unit configured to measure a gradient value of a voltage waveform of the reference voltage; and a pulse conversion unit configured to convert the gradient value into a first pulse width and store it. Further, the apparatus can include: an electrical power receiving unit configured to receive an input voltage from an external power source; and a voltage detection unit configured to compare the first pulse width with a second pulse width to detect an over voltage condition or an under voltage condition.

17 Claims, 7 Drawing Sheets

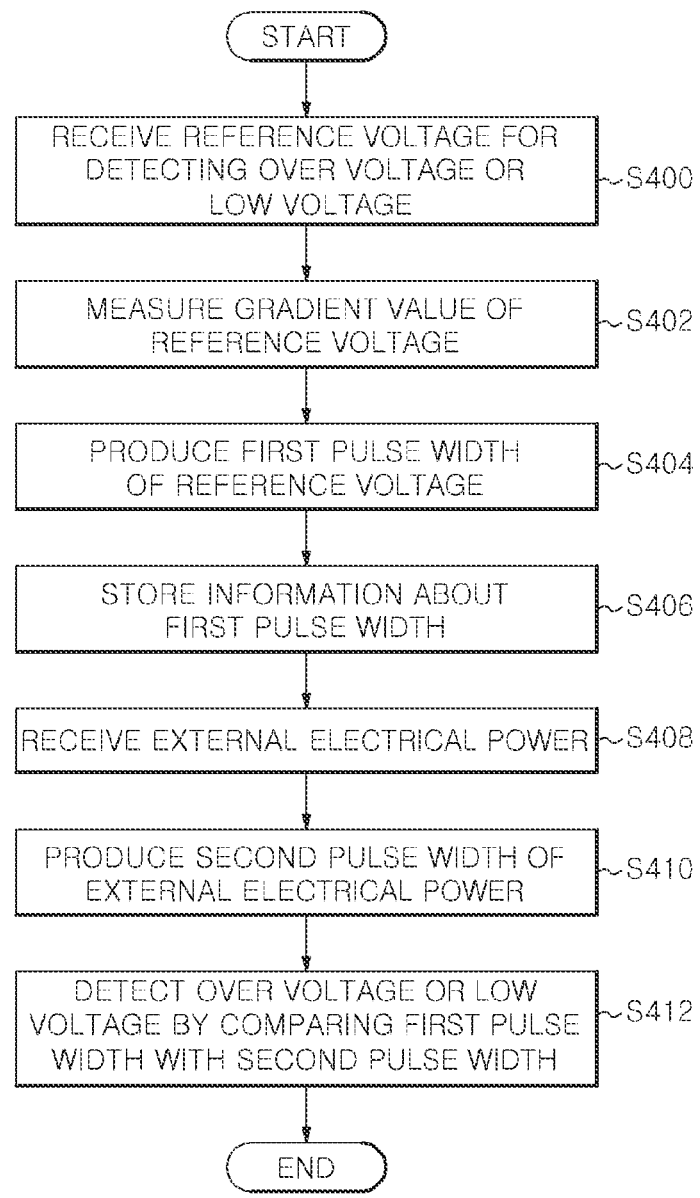

APPARATUSES AND METHODS FOR DETECTING OVER VOLTAGE AND/OR UNDER VOLTAGE

CROSS-REFERENCE TO RELATED APPLICATION

This application is based on and claims priority to Korean Patent Application No. 10-2013-0160017, filed on Dec. 20, 2013, the disclosure of which is incorporated herein in its entirety by reference.

TECHNICAL FIELD

Embodiments according to the present invention relate to an apparatus and method for detecting an over voltage and/or under voltage in electronic/electrical devices, and more particularly, to an apparatus and method for accurately detecting an over voltage condition and/or an under voltage condition in an electronic/electrical device by comparing reference voltage information with input voltage information, considering also the characteristic(s) of the component(s) used in the electronic/electrical device.

BACKGROUND

Typically, an electronic/electrical device that operates using AC (Alternating Current), such as a washing machine, TV, microwave oven, dishwasher, etc., may include an apparatus that detects an over voltage or under voltage by determining whether the AC voltage supplied from an external electrical power source is higher or lower than the operating voltage for the electronic/electrical device.

In general, such an apparatus detects the over voltage or under voltage by converting the applied AC voltage to a DC voltage, and then comparing the converted voltage with a predetermined reference voltage.

However, in such a conventional apparatus, the predetermined reference voltage is the same for all electronic/electrical devices that may utilize the apparatus, regardless of the characteristics of the components that are used in each electronic/electrical device.

For example, Korean Patent Laid-Open Publication No. 2004-0046213, which was laid-open on Jun. 5, 2004, discloses technology for sensing and displaying a power error in a washing machine.

SUMMARY

Embodiments according to the present disclosure provide apparatuses and methods for detecting an over voltage and/or under voltage in electronic/electrical devices, and more particularly, to apparatuses and methods for accurately detecting an over voltage condition and/or an under voltage condition in an electronic/electrical device by comparing reference voltage information with input voltage information, considering also the characteristic(s) of the component(s) used in the electronic/electrical device.

Exemplary embodiments according to the present disclosure provide an apparatus for detecting over voltage and/or under voltage, including a reference voltage receiving unit configured to receive a reference voltage, a gradient measuring unit configured to measure a gradient value at a point in a waveform of the reference voltage, a pulse conversion unit configured to convert the gradient value obtained from the gradient measuring unit into a first pulse width, an electrical power receiving unit configured to receive an input voltage from an external power source, and a voltage detection unit configured to compare the first pulse width with a second pulse width corresponding to the input voltage to detect an over voltage condition and/or an under voltage condition.

In one or more embodiments, the voltage detection unit is also provided with or accesses information about a third pulse width corresponding to a high voltage and a fourth pulse width corresponding to a low voltage. In such embodiments, the voltage detection unit is further configured to determine that the input voltage is in a normal range for the high voltage if the second pulse width is larger than the first pulse width but smaller than the third pulse width, and is also configured to determine that the input voltage is in a normal range for the low voltage if the second pulse width is smaller than the first pulse width but larger than the fourth pulse width.

In one or more embodiments, the voltage detection unit is further configured to determine that the input voltage is "over voltage" (over the operating voltage for the electronic/electrical device or component[s] thereof) if the electronic/electrical device is intended to operate at the low voltage and the second pulse width of the input voltage is larger than the first pulse width but smaller than the third pulse width.

In one or more embodiments, the voltage detection unit is further configured to determine that the operating voltage is "under voltage" (under the operating voltage for an electronic/electrical device) if the electronic/electrical device is intended to operate at the high voltage and the second pulse width of the input voltage is smaller than the first pulse width but larger than the fourth pulse width.

In one or more embodiments, the gradient measuring unit is further configured to measure a gradient value of the voltage waveform at a zero crossing point where the value of the reference voltage is zero on the waveform of the reference voltage.

In one or more embodiments, the gradient measuring unit is further configured to measure a gradient value using a photo coupler, and the gradient value depends on the CTR (Current Transfer Ratio) of the photo coupler.

In one or more embodiments, the reference voltage is in a range of 160V-180V.

In one or more embodiments, the pulse conversion unit is further configured to store information about the first pulse width of the reference voltage in memory.

In one or more embodiments, the high voltage is in a range of 220V-230V and the low voltage is in a range of 110V-120V.

Exemplary embodiments of the present disclosure also provide a method for detecting over voltage and/or low voltage. In one or more embodiments, the method includes: receiving a reference voltage used for detecting an over voltage condition and/or low voltage condition; measuring a gradient value of a waveform of the reference voltage; converting the gradient value into a first pulse width corresponding to the gradient value and storing it; receiving an input voltage from an external power source; and determining whether there is an over voltage condition or an under voltage condition by comparing the first pulse width with a second pulse width corresponding to the input voltage.

In one or more embodiments, information about a third pulse width corresponding to the first voltage, and information about a fourth pulse width corresponding to the second voltage, are provided. The input voltage is in a normal range for the high voltage if the second pulse width is larger than first pulse width but smaller than the third pulse width, and the input voltage is in a normal range for the low voltage if the second pulse width is smaller than the first pulse width but larger than the fourth pulse width.

In one or more embodiments, the method further includes determining that the input voltage is over voltage if the electronic/electrical device is intended to operate at the low voltage and the second pulse width of the input voltage is larger than the first pulse width but smaller than the third pulse width.

In one or more embodiments, the method further includes determining that the operating voltage is under voltage if the electronic/electrical device is intended to operate at the high voltage and the second pulse width of the input voltage is smaller than the first pulse width but larger than the fourth pulse width.

In one or more embodiments, to measure a gradient value, the method further includes detecting a zero crossing point where the reference voltage is zero on the voltage waveform of the reference voltage.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 4 is a flow diagram describing an example of a method for detecting an over voltage and/or under voltage in an embodiment according to the present invention.

DETAILED DESCRIPTION

Figure 1:
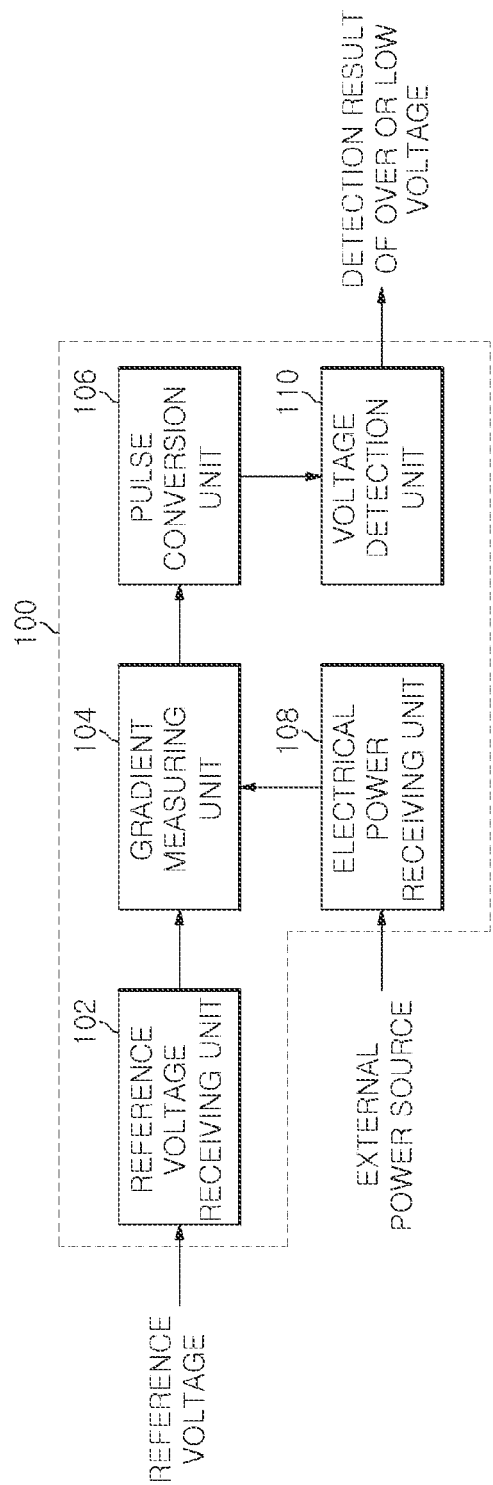
FIG. 1 is a block diagram of an apparatus for detecting over voltage and/or under voltage in an embodiment according to the present invention.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented herein.

One or more exemplary embodiments of the present disclosure will be described more fully hereinafter with reference to the accompanying drawings, in which one or more exemplary embodiments of the disclosure can be easily determined by those skilled in the art. As those skilled in the art will realize, the described exemplary embodiments may be modified in various different ways, all without departing from the spirit or scope of the present disclosure, which is not limited to the exemplary embodiments described herein.

It is noted that the drawings may be schematic and are not necessarily dimensionally illustrated. Relative sizes and proportions of parts in the drawings may be exaggerated or reduced, and a specified dimension is just exemplary and not limiting. The same reference numerals designate the same structures, elements, or parts illustrated in two or more drawings in order to exhibit similar characteristics.

The exemplary embodiments of the present disclosure illustrate ideal exemplary embodiments of the present disclosure in more detail. As a result, various modifications of the elements illustrated in the drawings are possible. Accordingly, the exemplary embodiments are not limited to a specific form of the illustrated elements and, for example, may include an element that is or can be modified during manufacturing.

FIG. 1 is a block diagram of an apparatus 100 for detecting over voltage and/or under voltage in an embodiment according to the present invention.

Referring to FIG. 1, the apparatus 100 includes a reference voltage receiving unit 102, a gradient measuring unit 104, a pulse conversion unit 106, and a voltage detection unit 110. The apparatus 100 may also include or be coupled to an electrical power receiving unit 108. The apparatus 100 may be used with or in any electronic/electrical device that is driven by AC voltage, such as a washing machine, TV, microwave oven, dishwasher, etc.

Hereinafter, the operations of the respective components of the apparatus 100 will be described in detail.

The reference voltage receiving unit 102 receives a reference voltage. The reference voltage refers to a voltage that is used as a reference or threshold for detecting over voltage and/or under voltage with respect to external electrical power (an input voltage) supplied to an electronic/electrical device such as a washing machine. If, for example, the operating voltage of the electronic/electrical device can be either a low voltage (e.g., 110V-120V) or a high voltage (e.g., 220V-230V), the reference voltage may be a median value of the low voltage and the high voltage values; thus, in this example, the reference voltage may be in the range of 160V-180V.

Figure 2:
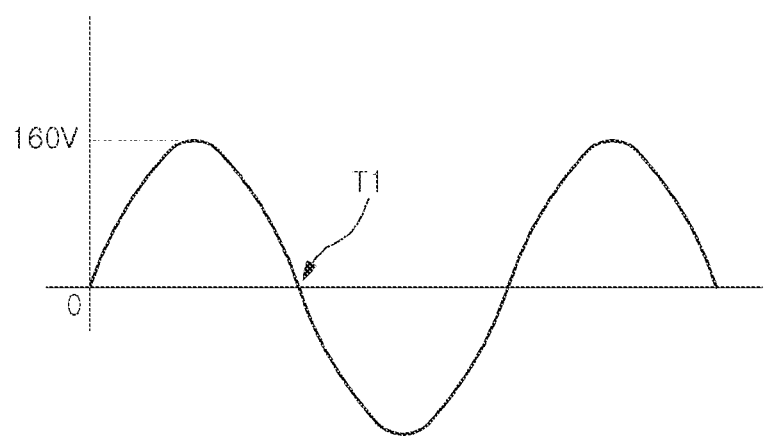
FIG. 2 is an exemplary AC voltage waveform for a reference voltage that may be used in an apparatus for detecting over voltage and/or under voltage in an embodiment according to the present invention.

The gradient measuring unit 104, in response to receiving the reference voltage from the reference voltage receiving unit 102, analyzes the AC waveform of the amplitude of the reference voltage and determines a gradient value at a zero crossing point T1 in the AC voltage waveform (FIG. 2).

FIG. 2 is an exemplary AC waveform of the amplitude of the reference voltage. A zero crossing point T1 refers to a point where the AC reference voltage waveform crosses the time axis. A gradient value may be determined, for example, by differentiating the amplitude of the AC reference voltage waveform at the zero crossing point T1.

In one embodiment, the gradient measuring unit 104 may obtain a gradient value for the reference voltage through the use of a photo coupler. The gradient value from the gradient measuring unit 104 is supplied to the pulse conversion unit 106 and converted into a pulse signal that corresponds to the gradient value. The width of this pulse signal, referred to herein as the first pulse width, can thus depend on the gradient value.

The pulse conversion unit 106 stores the first pulse width in a memory (not shown) of the electronic/electrical device. The memory may be, for example, an EEPROM (Electrically Erasable and Programmable Read Only Memory).

It is important to note that the width of the pulse signal based on the gradient value for the reference voltage waveform (the first pulse width) may be different from one device to another since the characteristics of components used in the devices to determine the gradient value, such as the CTR (Current Transfer Ratio) characteristic of the photo coupler, may not be exactly the same from one device to another. In other words, the characteristics of the components in the apparatus 100 (e.g., the gradient measuring unit 104 and the pulse conversion unit 106) are reflected in the first pulse width. By using a component-dependent (e.g., photo coupler-dependent) pulse width as a reference, an apparatus in one or more embodiments according to the present invention can accurately detect an over voltage condition and/or an under voltage condition, while also taking the characteristic(s) of the component(s) into consideration.

Returning to FIG. 1, the electrical power receiving unit 108 receives an input voltage from an external power source when the electronic/electrical device is connected to the external power source.

The input voltage supplied from the external power source is then converted into a second pulse width using the gradient measuring unit 104 and the pulse conversion unit 106. The converted second pulse is then supplied to the voltage detection unit 110.

The voltage detection unit 110 detects whether there is an over voltage condition and/or an under voltage condition in the electronic/electrical device by comparing the second pulse width (associated with the input voltage from the external power source) with the first pulse width (associated with the reference voltage) previously stored in a memory of the electronic/electrical device.

Hereinafter, the operation of the apparatus 100 in one or more embodiments according to the present invention will be described, referring to FIGS. 1 and 3A to 3D.

First, in addition to the first pulse width derived from the reference voltage, the electronic/electrical device may store a third pulse width and a fourth pulse width. The third pulse width is related to a high voltage and the fourth pulse width is related to a low voltage, and can be used as reference information to detect over voltage and/or under voltage. Here, the third pulse width and the fourth pulse width may have respective device-independent values, and may be stored in the electronic/electrical device.

Figure 3A:
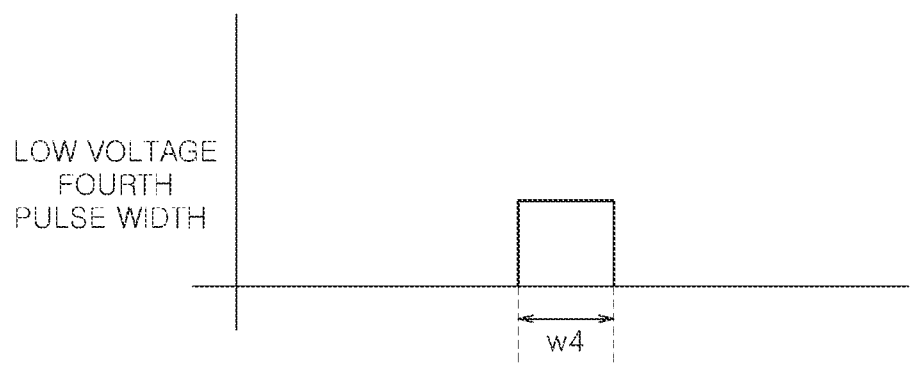
FIGS. 3A, 3B, 3C, and 3D show examples of pulse widths converted from different voltages in an embodiment according to the present invention.
Figure 3B:
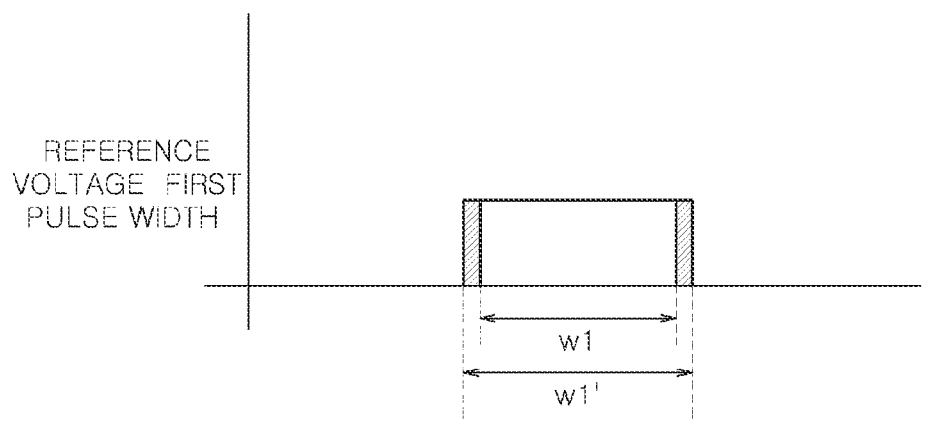
Figure 3C:
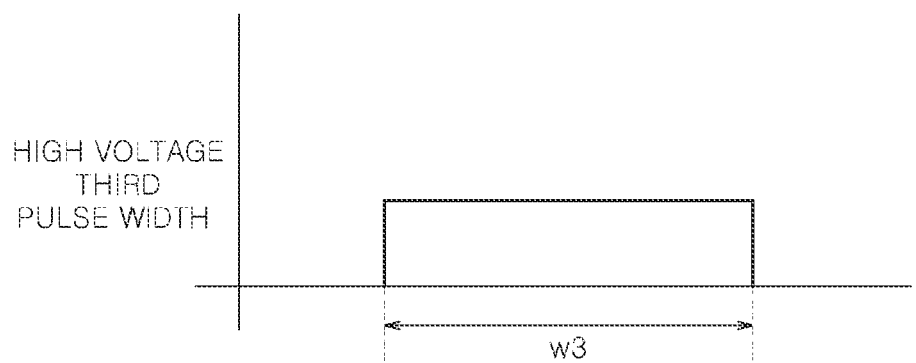
Figure 3D:
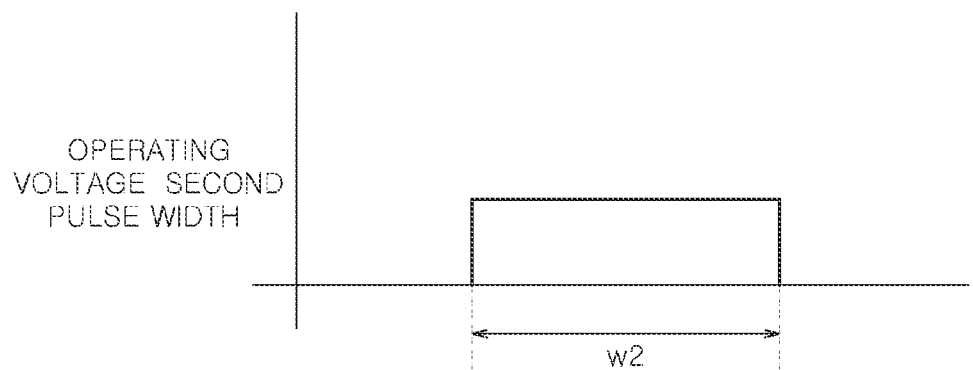

FIGS. 3A to 3D show illustrative pulse widths converted from different voltages. Referring to the examples illustrated in the drawings, the first pulse width w1-w1' derived from the reference voltage in the example of FIG. 3B is smaller than a third pulse width w3 in the example of FIG. 3C, but is larger than a fourth pulse width w4 in the example of FIG. 3A. As described above, in one embodiment, the first pulse width w1-w1' may be set as a median value between w1 and w1' depending on the CTR characteristics of a photo coupler.

The voltage detection unit 110 is provided with and/or can access information in memory about the first pulse width w1-w1', the third pulse width w3, and the fourth pulse width w4. When an input voltage is supplied, the voltage detection unit 110 compares the second pulse width w2 (see FIG. 3D), which corresponds to the input voltage as described above, with the first pulse width w1-w1', the third pulse width w3, and the fourth pulse width w4, to determine whether there is an over voltage condition and/or an under voltage condition.

As an example, assuming that the electronic/electrical device is intended to operate using a high input voltage (e.g., 220V), if the second pulse width w2 is larger than the first pulse width w1-w1', but smaller than the third pulse width w3, then the voltage detection unit 110 determines that the input voltage is in the normal high voltage range. If, instead, the electronic/electrical device is supposed to operate using a low input voltage (e.g., 110 V), then in this example the voltage detection unit 110 would determine that the input voltage is in an over voltage condition.

As another example, assuming that the electronic/electrical device is intended to operate using a low input voltage, if the second pulse width w2 is smaller than the first pulse width w1-w1' but larger than the fourth pulse width w4, then the voltage detection unit 110 determines that the input voltage is in the normal low voltage range. If, instead, the electronic/electrical device was supposed to operate using a high input voltage, then the voltage detection unit 110 would determine that the input voltage is in an under voltage condition.

FIG. 4 is a flow diagram describing an example of a method for detecting over voltage and/or low voltage in an embodiment according to the present invention.

First, the reference voltage receiving unit 102 of the apparatus 100 receives a reference voltage that can be used for detecting over voltage and/or under voltage (block S400).

Next, the reference voltage is provided to the gradient measuring unit 104 in order to obtain a gradient value for the reference voltage (block S402).

That is to say, the gradient measuring unit 104 obtains a gradient value by, e.g., performing a differential operation on the AC voltage waveform of the reference voltage at the zero crossing point T1 as shown in FIG. 2.

Thereafter, the gradient value of the reference voltage obtained by the gradient measuring unit 104 is provided to the pulse conversion unit 106. The pulse conversion unit 106 produces a pulse signal corresponding to the gradient value (from block S404) and stores the width of the pulse signal (the first pulse width, e.g., w1-w1') in memory (block S406).

Because, in one embodiment, the first pulse width w1-w1' depends on the CTR characteristics of the photo coupler, if different electronic/electrical devices have different CTR characteristics, then the first pulse width w1-w1' of the reference voltage will consequently be defined differently for each of the different electronic/electrical devices. This allows a reference voltage to be optimized or uniquely determined for each of the different electronic/electrical devices.

In one embodiment, the pulse width corresponding to the reference voltage may be determined beforehand and then stored in memory of the electronic/electrical device, e.g., the first pulse width can be determined during the manufacturing or assembly process for the electronic/electrical device, such as a washing machine. The first pulse width may be determined automatically or manually.

When the electronic/electrical device is in use, as the input voltage from the external power source is supplied via the electrical power receiving unit 108 (block S408), the input voltage is converted to the second pulse width w2 by the gradient measuring unit 104 and the pulse conversion unit 106 (block S410). The second pulse width is provided to the voltage detection unit 110.

Then, the voltage detection unit 110 checks if the input voltage is over voltage or under voltage, by comparing the second pulse width w2 with the first pulse width w1-w1' (block S412).

In one embodiment, the electronic/electrical device may store a third pulse width w3 (corresponding to a high voltage) and a fourth pulse width w4 (corresponding to a low voltage) as reference information that can be used, in addition to the first pulse width w1-w1', to detect an over voltage condition and/or an under voltage condition.

In such an embodiment, the voltage detection unit 110 can determine whether the operation (input) voltage is over voltage and/or under voltage by comparing the second pulse width w2 with the first pulse width w1-w1', the third pulse width w3, and the fourth pulse width w4.

As described above, using embodiments of an apparatus and method for detecting over voltage and/or low voltage according to the present invention, it is possible to detect more accurately whether the external (input) power/voltage supplied to an electronic/electrical device is over voltage and/or under voltage relative to the device's operating voltage, because the reference voltage is optimized for the electronic/electrical device taking into account the characteristic(s) of the device's component(s), e.g., the CTR characteristic of a photo coupler utilized by the electronic/electrical device.

Although exemplary embodiments according to the present disclosure are described above with reference to the accompanying drawings, those skilled in the art will understand that the present disclosure may be implemented in various ways without changing the necessary features or the spirit of the present disclosure.

Therefore, it should be understood that the exemplary embodiments described above are not limiting, but only an example in all respects. The scope of the present disclosure is expressed by claims below, not the detailed description, and it should be construed that all changes and modifications achieved from the meanings and scope of claims and equivalent concepts are included in the scope of the present disclosure.

From the foregoing, it will be appreciated that various embodiments of the present disclosure have been described herein for purposes of illustration, and that various modifications may be made without departing from the scope and spirit of the present disclosure. The exemplary embodiments disclosed in the specification of the present disclosure do not limit the present disclosure. The scope of the present disclosure will be interpreted by the claims below, and it will be construed that all techniques within the scope equivalent thereto belong to the scope of the present disclosure.

What is claimed is:

1. An apparatus for detecting over voltage and/or under voltage in an electronic/electrical device, the apparatus comprising:
   a reference voltage receiving unit configured to receive a reference voltage;
   a gradient measuring unit configured to measure a gradient value at a point in a waveform of the reference voltage;
   a pulse conversion unit configured to convert the gradient value obtained from the gradient measuring unit into a first pulse width corresponding to the gradient value;
   an electrical power receiving unit configured to receive an input voltage from an external power source;
   a voltage detection unit configured to compare the first pulse width with a second pulse width corresponding to the input voltage to detect an over voltage condition or an under voltage condition,
   wherein information about a third pulse width corresponding to a high voltage and a fourth pulse width corresponding to a low voltage is accessible to the voltage detection unit, and
   wherein the voltage detection unit is further configured to determine that the input voltage is in a normal range for the high voltage if the second pulse width is larger than the first pulse width but smaller than the third pulse width, and is also configured to determine that the input voltage is in a normal range for the low voltage if the second pulse width of the input voltage is smaller than the first pulse width but larger than the fourth pulse width.

2. The apparatus of claim 1, wherein the voltage detection unit is further configured to determine that the input voltage is over voltage if the electronic/electrical device is intended to operate at the low voltage and the second pulse width of the input voltage is larger than the first pulse width but smaller than the third pulse width.

3. The apparatus of claim 1, wherein the voltage detection unit is configured to determine that the input voltage has the under voltage condition when the electronic/electrical device is intended to operate at the high voltage and the second pulse width is smaller than the first pulse width but larger than the fourth pulse width.

4. The apparatus of claim 1, wherein the gradient measuring unit is further configured to measure the gradient value using a photo coupler, and wherein the gradient value depends on the photo coupler's CTR (Current Transfer Ratio).

5. The apparatus of claim 1, wherein the high voltage is in a range of 220V-230V and the low voltage is in a range of 110V-120V.

6. The apparatus of claim 1, wherein the gradient measuring unit is further configured to measure the gradient value of the voltage waveform at a zero crossing point where the value of the reference voltage is zero on the voltage waveform of the reference voltage.

7. The apparatus of claim 1, wherein the reference voltage is within a range of 160V-180V.

8. The apparatus of claim 1, wherein the pulse conversion unit is further configured to store the first pulse width of the reference voltage in a memory.

9. A method for detecting over voltage and/or under voltage, the method comprising:
   receiving a reference voltage;
   measuring a gradient value at a point in a waveform of the reference voltage;
   converting the gradient value into a first pulse width;
   receiving an input voltage from an external power source; and
   determining whether there is an over voltage condition or an under voltage condition by comparing the first pulse width with a second pulse width corresponding to the input voltage,
   wherein said determining further comprises:
   accessing information about a third pulse width corresponding to a high voltage and a fourth pulse width corresponding to a low voltage;
   comparing the second pulse width with the third pulse width, wherein the input voltage is in a normal range for the high voltage if the second pulse width is larger than first pulse width but smaller than the third pulse width; and
   comparing the second pulse width with the fourth pulse width, wherein the input voltage is in a normal range for the low voltage if the second pulse width is smaller than the first pulse width but larger than the fourth pulse width.

10. The method of claim 9, wherein said measuring a gradient value comprises detecting a zero crossing point where the reference voltage is zero on the waveform of the reference voltage.

11. The method of claim 9, wherein the gradient value is determined using a photo coupler.

12. The method of claim 11, wherein the gradient value depends on the photo coupler's CTR (Current Transfer Ratio).

13. An electronic/electrical device, comprising:
   an electrical power receiving unit configured to receive an input voltage from an external power source; and
   an apparatus for detecting over voltage and/or under voltage, the apparatus comprising:
   a reference voltage receiving unit configured to receive a reference voltage;

a gradient measuring unit configured to measure a gradient value at a point in a waveform of the reference voltage;
a pulse conversion unit configured to convert the gradient value obtained from the gradient measuring unit into a first pulse width corresponding to the gradient value; and
a voltage detection unit configured to compare the first pulse width with a second pulse width corresponding to the input voltage to detect an over voltage condition or an under voltage condition,
wherein information about a third pulse width corresponding to a high voltage and a fourth pulse width corresponding to a low voltage is accessible to the voltage detection unit, and
wherein the voltage detection unit is further configured to determine that the input voltage is in a normal range for the high voltage if the second pulse width of the input voltage is larger than the first pulse width but smaller than the third pulse width, and is also configured to determine that the input voltage is in a normal range for the low voltage if the second pulse width of the input voltage is smaller than the first pulse width but larger than the fourth pulse width.

14. The electronic/electrical device of claim 13, wherein the voltage detection unit is further configured to determine the input voltage is over voltage if the electronic/electrical device is intended to operate at the low voltage and the second pulse width of the input voltage is larger than the first pulse width but smaller than the third pulse width.

15. The electronic/electrical device of claim 13, wherein the voltage detection unit is further configured to determine the input voltage is under voltage if the electronic/electrical device is intended to operate at the high voltage and the second pulse width of the input voltage is smaller than the first pulse width but larger than the fourth pulse width.

16. The electronic/electrical device of claim 13, wherein the gradient measuring unit is further configured to measure, using a photo coupler, the gradient value at a zero crossing point where the value of the reference voltage is zero on the voltage waveform of the reference voltage, and the gradient value depends on the photo coupler's CTR (Current Transfer Ratio).

17. The electronic/electrical device of claim 13, wherein the pulse conversion unit is further configured to store the first pulse width in a memory.

* * * * *